United States Patent
Furusho

(10) Patent No.: US 8,506,830 B2
(45) Date of Patent: Aug. 13, 2013

(54) PATTERN FORMATION METHOD

(75) Inventor: Kenji Furusho, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 13/040,047

(22) Filed: Mar. 3, 2011

(65) Prior Publication Data

US 2011/0290759 A1     Dec. 1, 2011

(30) Foreign Application Priority Data

May 28, 2010 (JP) ................................ 2010-122693

(51) Int. Cl.
*B44C 1/22*     (2006.01)

(52) U.S. Cl.
USPC ............... 216/44; 216/12; 438/385; 438/685; 438/42

(58) Field of Classification Search
USPC .................. 216/44, 12; 438/385, 685, 42
See application file for complete search history.

(56) References Cited

U.S. PATENT DOCUMENTS

| | | | |
|---|---|---|---|
| 7,691,275 B2 | 4/2010 | Willson et al. | |
| 2004/0224261 A1 | 11/2004 | Resnick et al. | |
| 2010/0330807 A1 * | 12/2010 | Kobayashi | 438/689 |

FOREIGN PATENT DOCUMENTS

JP     2009-072976     4/2009

* cited by examiner

*Primary Examiner* — Duy Deo
*Assistant Examiner* — Mahmoud Dahimene
(74) *Attorney, Agent, or Firm* — Finnegan, Henderson, Farabow, Garrett & Dunner, L.L.P.

(57) ABSTRACT

A pattern is formed by: forming a first imprint mask layer on a processed member; forming a first imprint pattern of the first imprint mask layer using a first template; forming a second imprint mask layer made of a material having a different etching rate from the first imprint mask layer on the first imprint pattern; forming a second imprint pattern of the second imprint mask layer using a second template different from the first template; and etching the processed member using as a mask the second imprint mask layer on which the second imprint pattern is formed and the first imprint mask layer on which the first imprint pattern is formed.

8 Claims, 6 Drawing Sheets

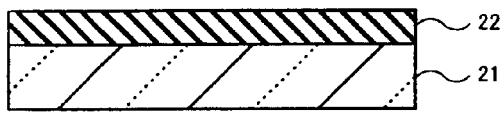
Fig.4A
RIE PROCESSING
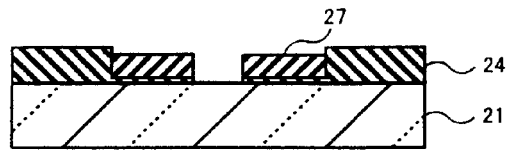
Fig.4F
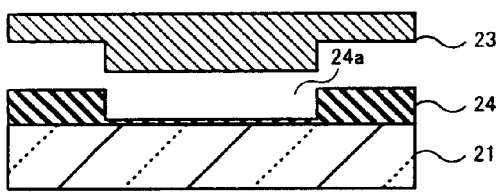
Fig.4B
RIE PROCESSING
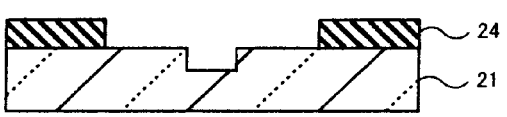
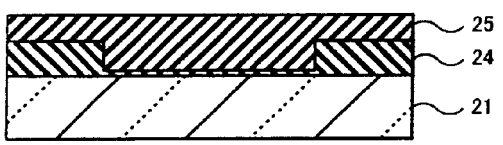
Fig.4C
Fig.4G
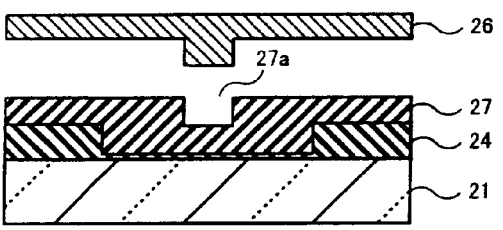
Fig.4D
RIE PROCESSING
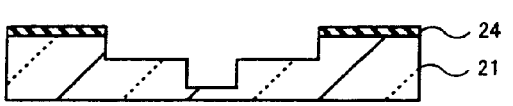
Fig.4H
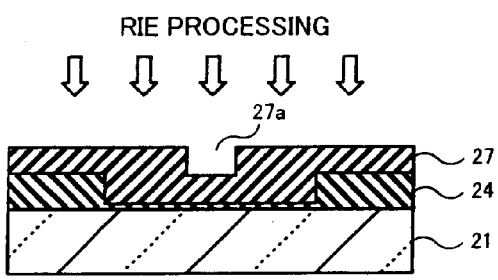
Fig.4E
RIE PROCESSING
Fig.4I

PATTERN FORMATION METHOD

CROSS-REFERENCE TO RELATED APPLICATION

This application is based upon and claims the benefit of priority from the prior Japanese Patent Application No. 2010-122693 filed on May 28, 2010, the entire contents of which are incorporated herein by reference.

BACKGROUND

Embodiments described herein related generally to a pattern formation method.

Accompanying miniaturization of semiconductor devices and magnetic recording devices, development of a more precise processing control technique in the depth direction is required. Conventionally, although a pattern processing has been performed by using a thick film resist and forming a mask pattern, accompanying further miniaturization, there is a problem pattern collapse due to an increase of the aspect ratio and a decrease of the focus margin make pattern formation itself difficult.

Hence, by forming as a mask a film which is different from a resist mask such as a hard mask of a SOG (Spin on Glass), SiN film or the like, it is possible to improve processing precision in the depth direction to some extent. However, processing patterns become complex by, for example, collectively process dual damascene structures, and therefore there is a problem that cost increases.

In recent years, as a miniaturization processing method, an imprint lithography technique is used of forming an imprint pattern by transferring a template on which a pattern is formed, to a coated film of a plastic or curable imprint mask material, and performing pattern processing using this pattern as a mask.

BRIEF DESCRIPTION OF THE DRAWINGS

FIGS. 2A to 2H, 4A to 4I and 6A to 6I are views illustrating pattern formation steps according to an embodiment.

DETAILED DESCRIPTION

Figure 1:
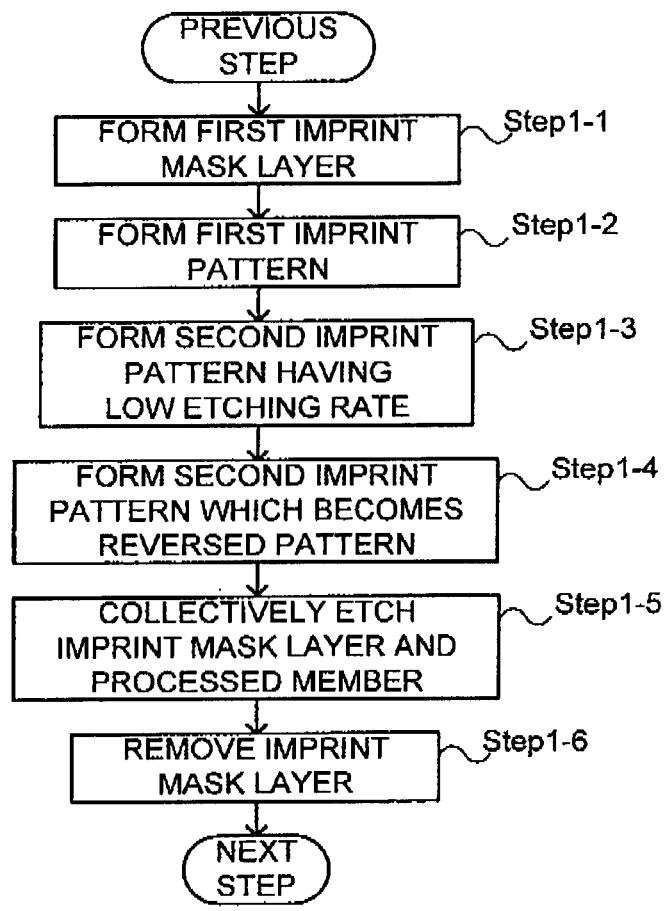
FIGS. 1, 3 and 5 are flowcharts illustrating pattern formation steps according to an embodiment.

Reference will now be made in detail to the present embodiment of the invention, an example of which is illustrated in the accompanying drawings. Wherever possible, the same reference numbers will be used throughout the drawing to refer to the same or like parts.

First Embodiment

The pattern formation method according to the present embodiment will be described using a flowchart illustrated in FIG. 1 and sectional views illustrated in FIGS. 2A to 2H.

Figure 2A:
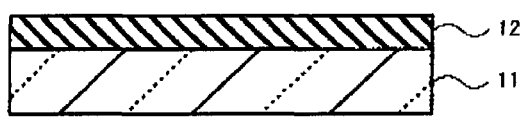

As illustrated in FIG. 2A, by using a first imprint mask material made of, for example, a thermal-plastic resin or optically cured resin, a first imprint mask layer 12 is formed on a processed member 11 such as a semiconductor substrate of Si, SOI (Silicon On Insulator) or the like, using, for example, an ink-jet or coating method (Step 1-1). The processed member 11 is not necessarily a substrate, and may be a processed film such as a silicon oxide film or silicon nitride film formed on a substrate.

Figure 2E:
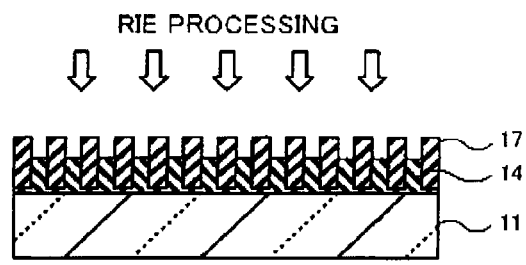
Figure 2B:
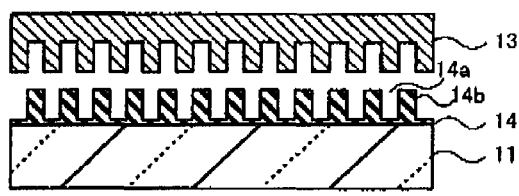

As illustrated in FIG. 2B, by having a first template 13 contact the first imprint mask layer 12 and curing the first imprint mask layer 12 in this state, the first imprint pattern having openings 14a and convex patterns 14b are formed (Step 1-2).

The first imprint mask layer 12 is cured by, for example, light or heat. In case of optical imprinting, the first imprint mask layer 12 is cured by being radiated ultraviolet light. In case of thermal imprinting, the first imprint mask layer 12 is cured by being applied a temperature change.

Figure 2F:
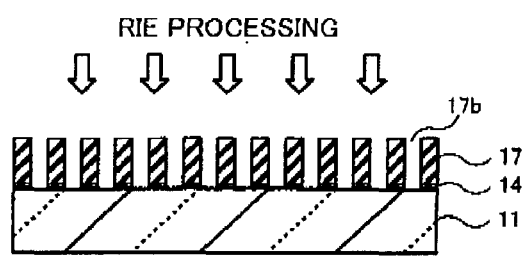
Figure 2C:

As illustrated in FIG. 2C, by using a second imprint mask material made of, for example, the same resin as the first layer, a second imprint mask layer 15 is formed on the first imprint mask layer 14 on which the first imprint pattern is formed, by using an ink-jet or coating method such that the opening parts 14a of the imprint pattern 14 are buried (Step 1-3). In this case, a second imprint mask material is used which has a lower etching rate of the second imprint mask layer 15 in etching processing of the processed member 11 which will be described later than an etching rate of the first imprint mask material of the first imprint mask layer 12.

The etching rate depends on, for example, the content of C, O, F or H, and decreases when the density of C increases or the density of O, F or H decreases. Consequently, compared to these imprint mask materials, a second imprint mask material can be used which has a higher density of C or a smaller parameter represented by (the total number of atoms of C, H and O)/(the number of atoms of C−the number of atoms of O) than the first imprint mask material. Hereinafter, by adequately selecting materials having different densities of C and the like, the etching rate is adjusted to increase or decrease in the imprint mask material in the same manner.

Figure 2G:
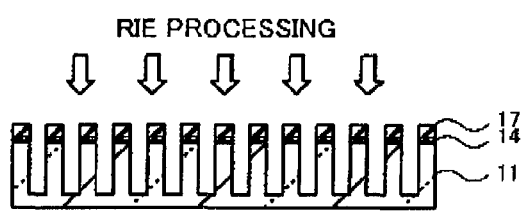
Figure 2D:
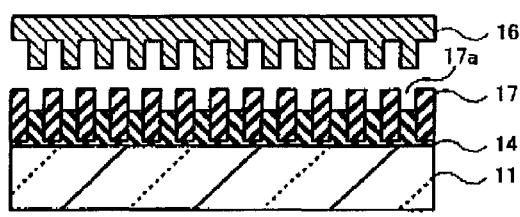

As illustrated in FIG. 2D, by having a second template 16 contact the second imprint mask layer 15 and curing the second imprint mask layer 15 in this state similar to the first imprint mask layer 12, the second imprint pattern is formed (Step 1-4). In this case, the pattern of the second template 16 has a shape in which the reverse pattern of the pattern of the previously used first template 13, that is, the positions of the concave parts (opening parts) of the first template 13 match the positions of the convex parts of the second template 16. In this case, as long as opening parts 17a of a second imprint mask layer 17 on which the second imprint pattern is formed are formed on the upper part of the convex patterns 14b of the first imprint pattern 14, a little offset is allowed and the pattern does not necessarily need to be strictly reversed.

As illustrated in FIG. 2E, by using the second imprint mask layer 17 as a mask, the first imprint mask layer 14 on which the opening parts of the second imprint pattern 17 are formed is etched by RIE (Reactive Ion Etching) processing (Step 1-5).

In the lower part of the opening parts 17a of the second imprint mask layer 17, the first imprint mask layer 14 is formed which has a higher etching rate than the second imprint mask layer 17. Therefore, etching of the lower part of the opening parts 17a proceeds faster than the area on which the second imprint mask layer 17 is formed (FIG. 2F). Consequently, it is possible to remove the first imprint mask layer 14 formed in the lower part of the opening parts 17a of the second imprint mask layer 17 without substantially reducing the film thickness of the second imprint mask layer 17. In this case, handling does not occur, so that it is possible to maintain a pattern shape without collapsing a pattern.

Figure 2H:

Further, when etching proceeds, a pattern of a desired depth is formed in the processed member 11 as illustrated in FIG. 2G. In this case, by using as a mask the second imprint pattern 17 having a higher aspect ratio than the first imprint pattern 14, it is possible to secure a sufficient film thickness for etching the processed member 11. The remaining first and second imprint mask layers 14 and 17 are removed (Step 1-6), so that a desired pattern illustrated in FIG. 2H is formed.

According to the present embodiment, it is possible to form on a processed member a pattern having, for example, a higher aspect ratio than 2.5 without collapsing a pattern of an imprint mask layer.

Second Embodiment

Figure 3:
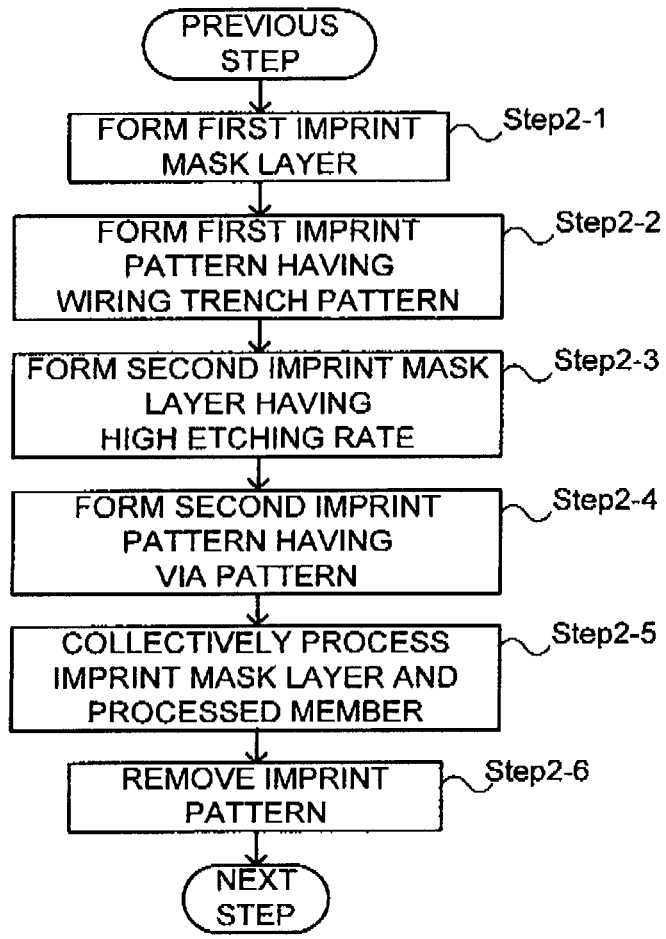

The pattern formation method according to the present embodiment will be described using a flowchart illustrated in FIG. 3 and sectional views illustrated in FIGS. 4A to 4I.

As illustrated in FIG. 4A, by using the first imprint mask material, the first imprint mask layer 22 is formed on a processed member 21 such as an interlayer insulating film formed with, for example, TEOS (Tetra EthOxy Silane) film or a low-permittivity film such as SiOC film formed on a semiconductor substrate, similar to the first embodiment (Step 2-1).

As illustrated in FIG. 4B, by having a first template 23 contact the first imprint mask layer 22, a first imprint pattern is formed which has an opening part 24a for forming, for example, a wiring trench pattern (Step 2-2).

As illustrated in FIG. 4C, by using the second imprint mask material, a second imprint mask layer 25 is formed on the first imprint mask layer 24 on which the first imprint pattern is formed similar to the first embodiment, such that the opening part 24a of the imprint pattern 24 is buried (Step 2-3). In this case, a second imprint mask material is used which has a higher etching rate of the second imprint mask layer 25 in etching processing of the processed member 21 which will be described later than the etching rate of the first imprint mask material of the first imprint mask layer 22.

As illustrated in FIG. 4D, by having a second template 26 contact the second imprint mask layer 25, a second imprint pattern is formed which has an opening part 27a for forming, for example, a via pattern (Step 2-4). By this means, the opening part 27a is provided on part of the opening part 24a which is previously formed.

As illustrated in FIG. 4E, by using as a mask the second imprint mask layer 27 on which the second imprint pattern formed in this way is formed, the processed member 21 is collectively processed by RIE processing and the like (Step 2-5).

In this case, the second imprint mask layer 27 having a high processing rate is etched, so that the processed member 21 is exposed as illustrated in FIG. 4F. Further, in the lower part of the opening part 27a, the processed member 21 is etched and the area of the second imprint mask layer 27 other than the opening part 27a is etched, so that the processed member 21 is exposed as illustrated in FIG. 4G.

Further, when etching further proceeds, a pattern having a desired multilevel structure in the processed member 21 is formed as illustrated in FIG. 4H. When a multilevel structure is formed by providing differences in level in an imprint mask material of one type in a conventional manner, the differences between film thicknesses of imprint masks in respective areas must be increased to collectively form a wiring trench and via hole in the processed member 21, and therefore it is difficult to form a pattern while preventing defects and the like. By contrast with this, with the present embodiment, a plurality of imprint mask materials having different etching rates per area are used, so that it is possible to prevent defects and the like upon pattern formation.

As illustrated in FIG. 4I, the remaining first and second imprint mask layers 24 and 27 are removed (Step 2-6), so that a desired pattern is formed.

According to the present embodiment, it is possible to collectively process and form a pattern having a multilevel structure by using a plurality of imprint mask materials having different etching rates.

Third Embodiment

Figure 5:
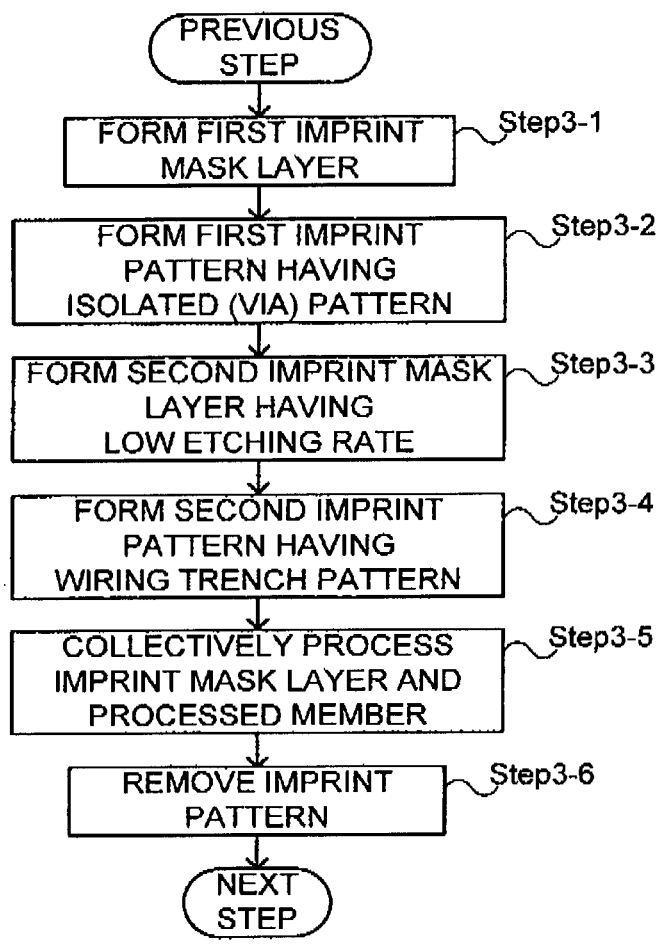

The pattern formation method according to the present embodiment will be described using a flowchart illustrated in FIG. 5 and sectional views illustrated in FIGS. 6A to 6I.

Figure 6A:
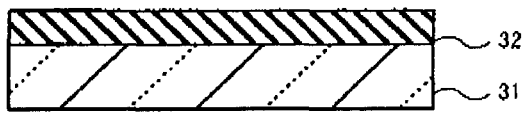

As illustrated in FIG. 6A, by using the first imprint mask material, the first imprint mask layer 32 is formed on a processed member 31 such as an interlayer insulating film formed with, for example, a low-permittivity film formed on a semiconductor substrate, similar to the first embodiment (Step 3-1).

Figure 6B:
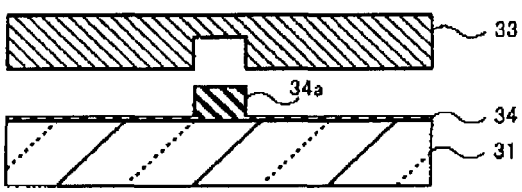

As illustrated in FIG. 6B, by having a first template 33 contact the first imprint mask layer 32, a first imprint pattern is formed which has an isolated pattern 34a which becomes, for example, a via pattern (Step 3-2).

Figure 6C:
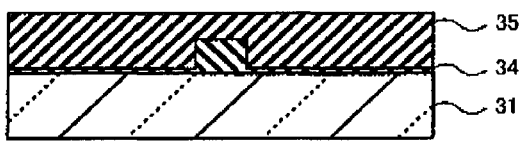

As illustrated in FIG. 6C, by using the second imprint mask material, a second imprint mask layer 35 is formed on the first imprint mask layer 34 on which the first imprint pattern including the upper side of the isolated pattern 34a is formed, similar to the first embodiment (Step 3-3). In this case, an imprint mask material of the second layer is used which has a lower etching rate of the second imprint mask layer 35 in etching processing of the processed member 31 which will be described later than an etching rate of the first imprint mask material of the first imprint mask layer 32.

Figure 6D:
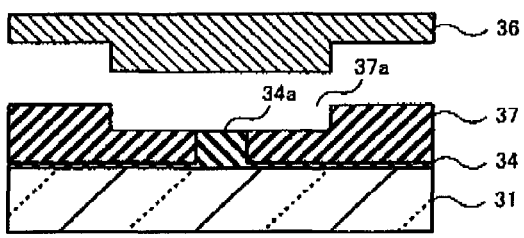
Figure 6E:
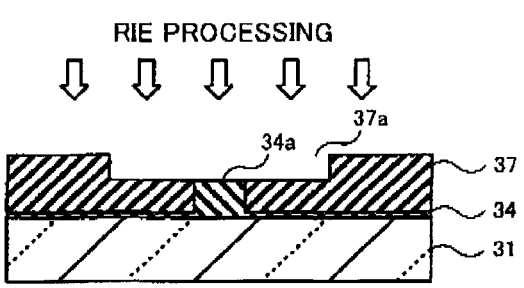

As illustrated in FIG. 6D, by having a second template 36 contact the second imprint mask layer 35, a second imprint pattern is formed which has an opening part 37a for forming, for example, a wiring trench pattern (Step 3-4). By this means, the opening part 37a is provided in an area including the upper side of the isolated pattern 34a which is previously formed.

As illustrated in FIG. 68, by using as a mask the second imprint mask layer 37 on which the second imprint pattern is formed, the processed member 31 is processed by RIE processing (Step 3-5).

Figure 6F:
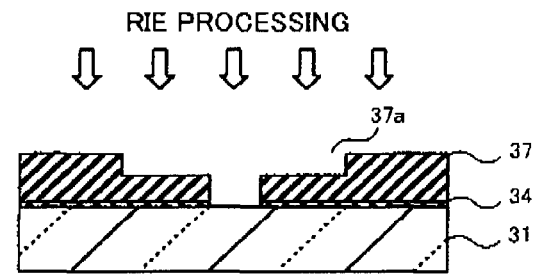

In this case, etching of the isolated pattern 34a of the first imprint mask layer 34 having a high processing rate in the lower part of the opening part 37a of the second imprint mask layer 37 proceeds faster than the other area. Further, as illustrated in FIG. 6F, the processed member 31 is exposed.

Figure 6G:
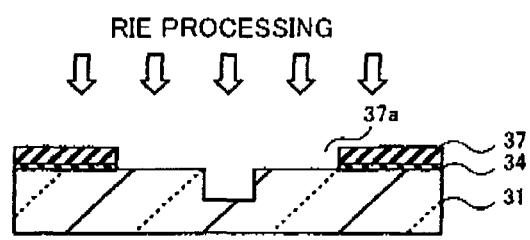
Figure 6H:
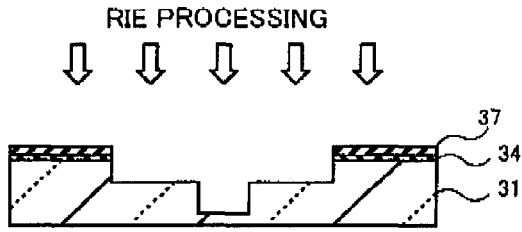

Furthermore, when the second imprint mask layer 37 is further etched, the processed member 31 in the lower part of the opening part 37a of the thin film thickness is exposed as illustrated in FIG. 6G. Still further, when etching further proceeds, a pattern having a desired multilevel structure in the processed member 31 is formed as illustrated in FIG. 6H.

Figure 6I:

As illustrated in FIG. 6I, the remaining first and second imprint mask layers 34 are removed (Step 2-6), so that a desired pattern is formed.

When a multilevel structure is formed by providing differences in level in an imprint mask material of one type in a conventional manner, the differences between film thicknesses of imprint masks in respective areas must be increased to collectively form a wiring trench and via hole in the processed member 31, and therefore it is difficult to form a pattern while preventing defects and the like. By contrast with this, with the present embodiment, a plurality of imprint mask materials having different etching rates per area are used, so that it is possible to prevent defects and the like upon pattern formation.

According to the present embodiment, it is possible to collectively process and form a pattern having a multilevel structure.

With these embodiments, the processed member is not limited in particular, and the processed member may be not only a semiconductor substrate such as Si, SOI or the like as described above, and an interlayer insulating film such as a TEOS film, a low-permittivity film of SioC film or the like provided in the upper layer of the semiconductor substrate, but also a recording medium substrate such as glass, aluminum, ceramics or carbon.

A material which can form a transfer pattern only needs to be used as an imprint mask material, and, for example, the above described thermal-plastic resin or optically-cured resin, or a highly-viscous material such as SOC can be used.

When a thermal-plastic resin is used, a pattern can be formed by heating and coating an imprint mask material to the thermal-plastic resin, having a template contact the thermal-plastic resin and cooling the thermal-plastic resin.

When an optically-cured resin is used, a pattern can be formed by coating an imprint mask material to the optically-cured resin, having a translucent template such as quartz contact the optically-cured resin and exposing the optically-cured resin.

Further, when a highly-viscous material such as SOG is used, a pattern can be formed by pressing a template against the highly-viscous material.

While certain embodiments have been described, these embodiments have been presented by way of example only, and are not intended to limit the scope of the inventions. Indeed, the novel embodiments described herein may be embodied in a variety of other forms; furthermore, various omission, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method for forming a trench comprising:

forming a first imprint mask layer on a processed member;

forming a first imprint pattern of the first imprint mask layer using a first template;

forming a second imprint mask layer made of a material comprising a different etching rate from the first imprint mask layer on the first imprint pattern, when etched with the same etching process;

forming a second imprint pattern of the second imprint mask layer using a second template different from the first template; and etching the processed member using as a mask the second imprint mask layer having the second imprint pattern and the first imprint mask layer having the first imprint pattern is formed, wherein an etching rate of the first imprint mask layer is higher than that of the second imprint mask layer, and the second imprint pattern is a reversed pattern of the first imprint pattern.

2. The pattern formation method according to claim 1, wherein the processed member is etched with RIE.

3. The pattern formation method according to claim 2, wherein the first imprint mask layer or the second imprint mask layer is cured by light or heat.

4. The pattern forming method according to claim 3, wherein the first imprint mask layer is etched using as a mask the second imprint mask layer, and the processed member is further etched using as a mask the first imprint mask layer which is etched and the second imprint mask layer.

5. The pattern formation method according to claim 3, wherein a trench is formed in the processed member.

6. The pattern formation method according to claim 3, wherein a first opening part of the second imprint mask layer is formed on an upper part of a convex pattern of the first imprint mask layer.

7. The pattern formation method according to claim 3, wherein a carbon density of the first imprint mask layer is lower than a carbon density of the second imprint mask layer.

8. The pattern formation method according to claim 3, wherein a parameter represented by (numbers of all atoms of C, H and O)/(a number of atoms of C−a number of atoms of O) in the first imprint mask layer is greater than the parameter of the second imprint mask layer.

* * * * *